US012385698B2

(12) United States Patent
Kinemuchi et al.

(10) Patent No.: US 12,385,698 B2
(45) Date of Patent: Aug. 12, 2025

(54) SOLID HEAT STORAGE MATERIAL ADJUSTED IN THERMAL CONDUCTIVITY AND COMPOSITE INCLUDING THE SAME

(71) Applicant: NATIONAL INSTITUTE OF ADVANCED INDUSTRIAL SCIENCE AND TECHNOLOGY, Tokyo (JP)

(72) Inventors: Yoshiaki Kinemuchi, Nagoya (JP); Asaya Fujita, Nagoya (JP); Hiroyuki Nakayama, Nagoya (JP); Kimihiro Ozaki, Nagoya (JP); Haruka Abe, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 240 days.

(21) Appl. No.: 17/924,167

(22) PCT Filed: May 14, 2021

(86) PCT No.: PCT/JP2021/018448
§ 371 (c)(1),
(2) Date: Nov. 9, 2022

(87) PCT Pub. No.: WO2021/230357
PCT Pub. Date: Nov. 18, 2021

(65) Prior Publication Data
US 2023/0175789 A1 Jun. 8, 2023

(30) Foreign Application Priority Data
May 14, 2020 (JP) .................................. 2020-085223

(51) Int. Cl.
*F28D 20/02* (2006.01)
*C09K 5/14* (2006.01)

(52) U.S. Cl.
CPC ................ *F28D 20/02* (2013.01); *C09K 5/14* (2013.01)

(58) Field of Classification Search
CPC .................................. F28D 20/02; C09K 5/14
(Continued)

(56) References Cited

U.S. PATENT DOCUMENTS 5,596,877 A * 1/1997 Morrison .............. F28D 20/021
62/434
2013/0344335 A1* 12/2013 Gao ....................... C01G 31/02
501/41
(Continued)

FOREIGN PATENT DOCUMENTS

CN 102816944 12/2012
EP 3 203 172 8/2017
(Continued)

OTHER PUBLICATIONS

International Search Report (ISR) issued Aug. 24, 2021 in International (PCT) Application No. PCT/JP2021/018448.
(Continued)

*Primary Examiner* — Joel M Attey
(74) *Attorney, Agent, or Firm* — Wenderoth, Lind & Ponack, L.L.P.

(57) ABSTRACT

A solid heat storage material includes a bonding of vanadium dioxide and a highly thermally conductive substance higher in thermal conductivity than the vanadium dioxide, the highly thermally conductive substance being dispersed in the vanadium dioxide, the vanadium dioxide and the highly thermally conductive substance adhering closely and
(Continued)

densely together, the highly thermally conductive substance having a volume fraction of 0.03 or more.

12 Claims, 9 Drawing Sheets

(58) Field of Classification Search
USPC .......................................................... 165/10
See application file for complete search history.

(56) References Cited

U.S. PATENT DOCUMENTS

| | | | |
|---|---|---|---|
| 2016/0130492 A1* | 5/2016 | Matsumura | H01L 23/427 252/75 |
| 2016/0156213 A1 | 6/2016 | Yajima et al. | |
| 2017/0043553 A1* | 2/2017 | Tanaka | H01L 23/3737 |
| 2017/0276436 A1 | 9/2017 | Kasamatsu et al. | |
| 2017/0298262 A1 | 10/2017 | Kasamatsu et al. | |
| 2018/0307122 A1* | 10/2018 | Sugiyama | G06F 1/1686 |
| 2019/0032979 A1* | 1/2019 | Kasamatsu | F28D 20/0056 |
| 2025/0043328 A1* | 2/2025 | Fujimura | C12Q 1/6816 |

FOREIGN PATENT DOCUMENTS

| | | |
|---|---|---|
| JP | 2021-21128 | 2/2021 |
| KR | 10-1907605 | 12/2018 |

OTHER PUBLICATIONS

Communication pursuant to Article 94(3) issued Jan. 15, 2025 in European Patent Application No. 21 804 325.5.
English machine translation of Second Office Action issued Sep. 26, 2024 in Chinese Application No. 202180035268.7.
Communication issued Apr. 29, 2024 in European Patent Application No. 21804325.5.
English machine translation of First Office Action issued Feb. 24, 2025 in Chinese Application No. 202180035268.7.

* cited by examiner

SOLID HEAT STORAGE MATERIAL ADJUSTED IN THERMAL CONDUCTIVITY AND COMPOSITE INCLUDING THE SAME

TECHNICAL FIELD

The present invention relates to a solid heat storage material adjusted in thermal conductivity and a composite including the solid heat storage material, and relates more particularly to a solid heat storage material including an bonding of vanadium dioxide and a highly thermally conductive substance, the solid heat storage material being adjusted in thermal conductivity, the solid heat storage material enabling wide-range adjustment in heat dissipation and heat storage.

BACKGROUND ART

An electronic device including a power semiconductor has encountered the problem of heat generation due to a reduction in the size of a chip or the like. There are two typical measures against the problem. One of the measures is that an improvement is made in heat dissipation with a member, which excels in thermal conductivity (e.g., a heat spreader), provided directly beneath a chip. The other is that an increase in thermal capacity inhibits a rise in temperature. In the latter case, for achievement of both a reduction in size and an increase in thermal capacity, utilization of latent heat has been examined (Patent Literature 1 and Patent Literature 2).

Many conventional latent heat storage materials employ the heat of fusion due to the phase change from a solid to a liquid, and thus heat storage density (latent heat per unit weight or per unit volume) is important in characteristic. Meanwhile, thermal conduction as an important factor in heat exchange has not been sufficiently examined. For example, the thermal conductivity of paraffin as a representative heat storage material is approximately 0.2 W/mK, which is too low for prompt heat dissipation/heat absorption. Therefore, for example, a structure having a large contact area between a heat storage material and a container that houses the heat storage material hermetically and selection of a material high in thermal conductivity for the container are essentially important in designing a heat exchanger. That is, the structure tends to be intricate.

In recent years, developed has been a solid heat storage material employing solid-solid phase transition (Patent Literature 3). The material described in Patent Literature 3 has electronic phase transition as the origin of latent heat and thus keeps its shape before and after phase transition without fusion. Thus, the present material can be used as a structural material having latent heat storage performance (Patent Literature 4, Patent Literature 5, and Non Patent Literature 1). That is, the present material can be used, for example, as a material for a heat exchanger, without any change. Because of no need to consider liquid leakage and no increase in thermal resistance due to capsulation, vanadium dioxide has received attention as a solid heat storage material that can overcome problems with a meltable heat storage material.

However, the thermal conductivity of vanadium dioxide is approximately 6 W/mK (Non Patent Literature 2 and Non Patent Literature 3). Thus, vanadium dioxide is inadequate as a heat dissipation material and has, as a disadvantage, a low effect of suppressing an excessive rise in temperature.

CITATION LIST

Patent Literature

Patent Literature 1: WO 2017/081833 A
Patent Literature 2: WO 2017/073010 A
Patent Literature 3: JP 568825 B2 (JP 2009-163510 A)
Patent Literature 4: JP 2018-128190 A
Patent Literature 5: JP 2016-79351 A
Patent Literature 6: WO 2019/026773 A Non Patent Literature Non Patent Literature 1: Press release, "Development of phase change heat storage member having both a high heat storage density and robustness", National Institute of Advanced Industrial Science and Technology, 2019 Mar. 1. (https://www.aist.go.jp/aist_j/press_release/pr2019/pr20190301/pr20190301.html)
Non Patent Literature 2: C. N. Berglund and H. J. Guggenhein, "Electric properties of VO2 near the semiconductor-metal transition", Physical Review B 185, 1022-33 (1969).
Non Patent Literature 3: S. Lee, K. Hippalgaonkar, F. Yang et al., "Anomalously low electronic thermal conductivity in metallic vanadium dioxide", Science 355, 371-374 (2017).

SUMMARY OF INVENTION

Technical Problem

The present invention has been made in order to solve such problems with the conventional technology as above, and an object of the present invention is to provide a solid heat storage material adjusted in thermal conductivity, the solid heat storage material having a large thermal conductivity and a high effect of suppressing an excessive rise in temperature and enabling wide-range adjustment in heat dissipation and heat storage.

Solution to Problem

According to the present invention, in order to solve the above problems, the following solid heat storage material is provided.

[1] A solid heat storage material including an bonding of vanadium dioxide and a highly thermally conductive substance higher in thermal conductivity than the vanadium dioxide, the highly thermally conductive substance being dispersed in the vanadium dioxide, the vanadium dioxide and the highly thermally conductive substance adhering closely and densely together, the highly thermally conductive substance having a volume fraction of 0.03 or more.

[2] The solid heat storage material according to [1] in the invention, in which the highly thermally conductive substance is copper.

[3] The solid heat storage material according to [1] or [2] in the invention, in which the vanadium dioxide as raw material has an excess of oxygen.

[4] The solid heat storage material according to any of [1] to [3] in the invention, in which no diffusion layer and no reaction phase are present at a bonded interface between the vanadium dioxide and the highly thermally conductive substance.

[5] The solid heat storage material according to any of [1] to [4] in the invention, in which the solid heat storage material is resistant to oxidative corrosion.

[6] The solid heat storage material according to any of [1] to [5] in the invention, in which the highly thermally conductive substance is oriented parallel to a direction of heat transfer.

[7] The solid heat storage material according to any of [1] to [6] in the invention, in which the vanadium dioxide has a transition temperature adjusted by doping.

[8] A composite including: the solid heat storage material according to any of [1] to [7] in the invention; and copper; in which the solid heat storage material and the copper are bonded together.

Advantageous Effects of Invention

According to the present invention, a substance that excels in thermal conductivity is bonded densely to vanadium dioxide, so that a heat absorption/heat generation characteristic that excels in time response is acquired, enabling effective utilization of a high heat storage density based on latent heat. Therefore, achieved is a solid heat storage material adjusted in thermal conductivity, the solid heat storage material having a large thermal conductivity and a high effect of suppressing an excessive rise in temperature and enabling wide-range adjustment in heat dissipation and heat storage.

DESCRIPTION OF EMBODIMENTS

Figure 1:
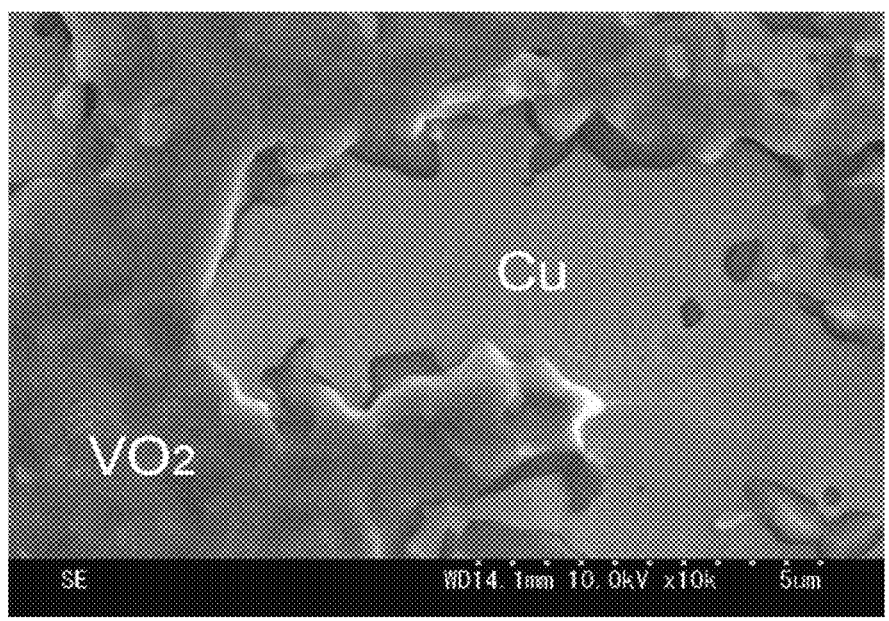
FIG. 1 is an electron micrograph of the bonded state between vanadium dioxide (VO2) and electrolytic copper powder (Cu) based on a sample in Example 1.

The present invention will be described in detail below on the basis of embodiments.

For an improvement in thermal response, the thermal conductivity of a material requires improving. A single crystal has few imperfections that scatter thermal vibration and thus is regarded as the maximum value in the thermal conductivity of its substance. It has been reported that the thermal conductivity of a vanadium dioxide single crystal is approximately 6 W/mK at room temperature (Non Patent Literature 2 and Non Patent Literature 3). For example, even an improvement in the crystallinity of vanadium dioxide or control of crystalline orientation of a polycrystal is not expected to make an improvement to a large thermal conductivity exceeding the value. Therefore, for an improvement in thermal conductivity, mixture with and dense and close adhesion to a substance that excels in thermal conductivity (e.g., copper, aluminum, or carbon fiber) are effective. However, an increase in the ratio of volume of a highly thermally conductive substance causes a linear decrease in the quantity of latent heat to the ratio of volume. Thus, although a large quantity of mixture is restricted, an excessively small quantity of mixture does not effect an improvement in thermal response.

The thermal conductivity of a mixture of dissimilar materials is maximum with a smallest quantity of dispersion in a case where the highly thermally conductive substance is oriented in one direction. The thermal conductivity k of a two-phase material is as follows:

$$k=(1-V_{highk}) \times k_{VO2} + V_{highk} \times K_{highk} \qquad (1)$$

where $V_{highk}$ represents the volume fraction of the highly thermally conductive substance, $k_{VO2}$ represents the thermal conductivity of vanadium dioxide, and $K_{highk}$ represents the thermal conductivity of the highly thermally conductive substance.

Therefore, for a desired thermal conductivity ($K_{limit}$) or more, the volume fraction of the high thermal conductive substance is required to satisfy the following expression:

$$V_{highk} \geq (K_{limit} - k_{VO2})/(K_{highk} - k_{VO2}) \qquad (2)$$

In consideration of thermal response required, for example, for a heat sink, the thermal conductivity is required to have a value not less than that of a typical metallic material. That is, the thermal conductivity is required to be not less than 15 W/mK corresponding to the thermal conductivity of stainless steel. Since the thermal conductivity of vanadium dioxide is 6 W/mK and the thermal conductivity of a typical highly thermally conductive substance (copper or silver) is approximately 400 W/mK, the volume fraction of the highly thermally conductive substance is required to be 0.03 or more for a thermal conductivity of 15 W/mK or more.

For measurement of thermal conductivity, there are a steady state method and an unsteady state method. For measurement about transition temperature, the steady state method is desirable in consideration of the influence of latent heat. However, for measurement out of the neighborhood of transition temperature, an appropriate selection is required to be made, for example, in accordance with the shape of the sample. For measurement of the quantity of latent heat, a differential scanning calorimeter is desirable.

In general, the wettability between an oxide and metal or carbon is low, leading to difficulty in high-density bonding. That is, material selection is required. For bonding of an oxide and metal, indirect bonding with brazing material or direct bonding is performed. The latter is desirable because of easily firmer bonding and a low interfacial thermal resistance.

Integration based on direct bonding progresses in a process similar to that of sintering. Thus, for examination with direct bonding, it is important to select a proper process temperature on the basis of the sintering temperature of each individual material.

A suitable range of sintering temperature for vanadium dioxide is 550 to 1050° C. Matching between the temperature range and the sintering temperature of a highly thermally conductive material enables uniform bonding with a wide-range volume fraction. For example, the sintering temperature of copper ranges from 500 to 800° C. The sintering temperature of aluminum ranges 500 to 600° C. However, carbon is difficult to sinter in the range of sintering temperature of vanadium dioxide.

In consideration of copper having a fusing point of 1085° C., its process window ranges from 550 to 1050° C., enabling a process in a wide temperature range. Thus, copper is suitable for combination with vanadium dioxide. Meanwhile, in consideration of aluminum having a film of oxide on its surface and having a low fusing point, which is 660° C., its process window ranges from 550 to 600° C., which is narrow. Thus, a favorable bond is unlikely to be obtained. In addition, carbon material requires a high temperature process at 900° C. or more. Furthermore, carbon has a problem with reaction to vanadium dioxide.

Facilitation of interface formation between dissimilar materials is important in bonding. Copper enables formation of a favorable interface with vanadium dioxide and thus is a preferable material. In particular, utilization of reaction between vanadium dioxide and oxygen enables obtainment of an interface that excels in close adhesion. Thus, preferably, the surface of vanadium dioxide is made to have an excess of oxygen.

Examples of a method of mixing an oxide and a highly thermally conductive substance include mixing physically the respective raw materials thereof and coating oxide powder with the highly thermally conductive substance by plating or sputtering. The latter method enables, as an advantage, uniform mixture even with a small quantity of addition. Meanwhile, such a physically mixing method is suitable to an increase in the volume ratio of a mixture. An appropriate selection is required to be made in accordance with a targeted form of mixture quantity/dispersion.

The form of the highly thermally conductive substance is typically granulous, linear, or tabular. In accordance with the direction of heat transfer, an appropriate selection is required to be made from thereamong. That is, for isotropic heat dissipation/heat absorption, a granulous highly thermally conductive substance is required, and for unidirectional heat transfer of heat dissipation/heat absorption, a linear or tabular highly thermally conductive substance is required to be oriented parallel to the direction. In the latter case, even a small quantity of highly thermally conductive substance has a large thermal conductivity, leading to retainment of a high volume fraction of vanadium dioxide. Thus, a reduction in latent heat due to the highly thermally conductive substance can be inhibited.

The phase transition temperature of vanadium dioxide can be adjusted by atomic doping, such as tungsten doping or chromium doping. There is no large difference between the sintering behavior of vanadium dioxide subjected to doping and the sintering behavior of vanadium dioxide not subjected to doping, so that vanadium dioxide subjected to doping can be sintered in a similar condition to that of vanadium dioxide not subjected to doping. That is, the above-described form can be applied in bonding without any change.

The interface between bonded materials causes interfacial thermal resistance, and thus control thereof is important. In particular, in a case where a reaction phase is generated at the interface, the thermal conductivity of the reaction phase is low due to solid solution effect, leading to an increase in interfacial thermal resistance. Therefore, from the viewpoint of thermal resistance, desirably, no reaction phase or diffusion layer is generated at the interface.

It has been reported that vanadium oxide has a problem with environment resistance (Patent Literature 6). In fact, vanadium oxide forms a hydrate, and thus attention needs to be paid to atmosphere in use. In particular, corrosion progresses easily under an acid environment. Thus, in general, use under an acid environment should be avoided. However, from the viewpoint of cathodic protection, bonding with a metal (copper or aluminum) smaller in work function than vanadium dioxide enables prevention of corrosion, so that a considerable improvement can be made in environment resistance. In this case, because of cathodic protection, all vanadium dioxide is not necessarily coated, differently from Patent Literature 6, but is required to be in electrical conduction.

A solid heat storage material according to the present invention includes an aggregate of vanadium dioxide and a highly thermally conductive substance higher in thermal conductivity than the vanadium dioxide, the highly thermally conductive substance being dispersed in the vanadium dioxide, the highly thermally conductive substance and the vanadium dioxide adhering closely and densely together, in which the highly thermally conductive substance has a volume fraction of 0.03 or more.

Examples of the highly thermally conductive substance higher in thermal conductivity than the vanadium dioxide include copper, silver, aluminum, an alloy including any metal of copper, silver, and aluminum, and carbon material. In particular, copper is preferable.

The aggregate included in the solid heat storage material according to the present invention requires the vanadium dioxide and the highly thermally conductive substance higher in thermal conductivity than the vanadium dioxide adhering closely and densely together. The "densely" denotes close adhesion at 90% or more of the theoretical density, more preferably, at 95% or more of the theoretical density. For an improvement in close adhesion, for example, desirably, heat treatment is performed at 250° C. for 20 minutes in the air in advance. The temperature of heat treatment and the duration of heat treatment can be properly set in consideration of the type of the highly thermally conductive substance and voidage to be achieved.

For measurement of density, a method based on Archimedes' principle is desirable in order to measure porosity accurately.

In the present invention, for an improvement in thermal response, the volume fraction of the highly thermally conductive substance has a lower limit of 0.03 (percentage: 3%). An increase in the volume fraction of the highly thermally conductive substance causes a linear decrease in the quantity of latent heat, and thus the volume fraction of the highly thermally conductive substance has an upper limit of approximately 0.75 (percentage: 75%). In accordance with a purpose, an appropriate volume fraction is required to be determined in the range. Because of the reciprocity between the quantity of latent heat and thermal response, for priority on the quantity of latent heat, preferably, the volume fraction is adjusted in the range of 0.03 to 0.40 (percentage: 3 to 40%). For the quantity of latent heat and thermal response in balance, preferably, the volume fraction is adjusted in the range of 0.40 to 0.60 (percentage: 40 to 60%). For priority on thermal response, preferably, the volume fraction is adjusted in the range of 0.60 to 0.75 (percentage: 60 to 75%).

As described above, facilitation of interface formation between dissimilar materials is important in bonding. Thus, for obtainment of an interface that excels in close adhesion with reaction between vanadium dioxide and oxygen, preferably, the surface of vanadium dioxide is made to have an excess of oxygen. The excess of oxygen denotes that oxygen is excessively included, approximately, by x=0.01 in the notation $VO_{2+x}$.

The solid heat storage material according to the present invention can be bonded to a highly thermally conductive material, such as a copper plate, for use. That is, a composite according to the present invention includes the solid heat storage material according to the present invention, and copper, in which the solid heat storage material and the copper are bonded together. As a bonding method, bonding with brazing material or diffusion bonding can be applied. For a reduction in interfacial thermal resistance, such diffusion bonding is desirable.

The solid heat storage material and the composite according to the present invention are not limited to the above embodiments.

EXAMPLES

The present invention will be further described in detail below with examples and comparative examples. However, the present invention is not limited to the following examples.

Example 1

Copper powder (purity 99.9%, particle size 45 μm mesh under, electrolytic copper powder) and vanadium dioxide powder (purity 99.9%, average particle diameter 1 μm) were bonded together. For an improvement in close adhesion, the vanadium dioxide powder was subjected to heat treatment at 250° C. for 20 minutes in the air in advance, resulting in having an excess of oxygen. Each type of powder was weighed such that a volume fraction of 0.00, a volume fraction of 0.25, a volume fraction of 0.50, a volume fraction of 0.75, and a volume fraction of 1.00 are obtained for copper, and then mixture was performed by a planetary stirrer. After that, in a vacuum, treatment was performed by an electric-current sintering apparatus with a molding pressure of 30 MPa at 550° C. for 30 minutes, resulting in obtainment of dense composite. All samples had 95% or more of the theoretical density. The theoretical density for vanadium dioxide-copper is determined by rule of mixture without any reactant as follows:

(Theoretical density)=(density of vanadium dioxide)×(volume fraction of vanadium dioxide)+(density of copper)×(volume fraction of copper)

FIG. 1 is an electron micrograph of a polished surface of a sample produced in the present example. Referring to FIG. 1, it was found that vanadium dioxide and copper are bonded together without any void.

In X-ray diffraction measurement, a diffraction pattern due to the copper and vanadium dioxide was detected, but no presence of any other impurity phase was recognized.

The thermal conductivities (k) of the produced samples were measured by a laser flash method (Netzsch LFA447). Results of the measurement are shown in FIG. 2.

Figure 2:
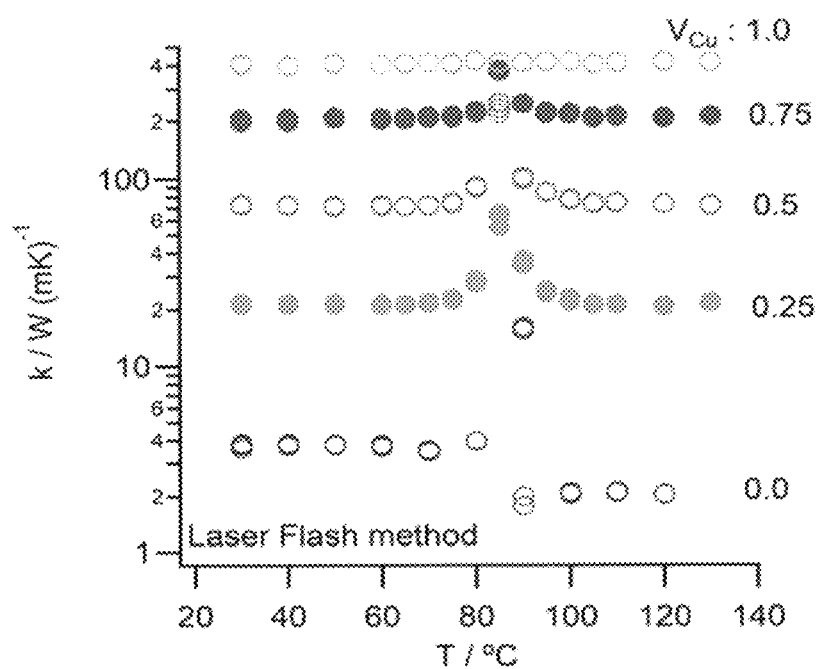
FIG. 2 illustrates the temperature dependence of thermal conductivity (k) of a vanadium dioxide/copper powder aggregate based on each sample in Example 1, where VCu represents the volume fraction of copper.

Referring to FIG. 2, it was found that an increase in the volume ratio of copper causes a considerable improvement in thermal conductivity all over the temperature range.

Figure 3:
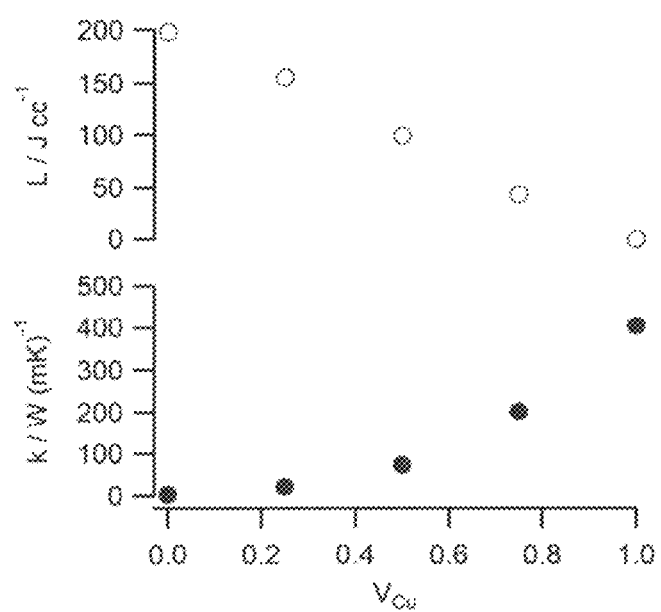
FIG. 3 illustrates the dependence of latent heat (L) and thermal conductivity (k) at room temperature on the volume fraction of copper (VCu) based on the samples in Example 1.

The latent heats (L) of the samples were measured by differential thermal analysis (Bruker DSC3300SA). FIG. 3 illustrates the dependence of latent heat (L) and thermal conductivity (k) on the volume fraction of copper. Referring to FIG. 3, it was found that the latent heat (L) decreases proportionately with the volume fraction of copper ($V_{Cu}$) but the thermal conductivity (k) increases quadratically.

Example 2

Aluminum powder (purity 99% up, particle size 300 μm mesh under, atomized powder) and vanadium dioxide powder were bonded together. For an improvement in close adhesion, the vanadium dioxide powder was subjected to heat treatment in advance, similarly to Example 1. Weighing was performed such that a volume fraction of 0.50 is obtained for aluminum, and then mixture was performed by a planetary stirrer. After that, in a vacuum, heat treatment was performed by an electric-current sintering apparatus with a molding pressure of 30 MPa at a temperature of 600° C. for 30 minutes. As a result, a dense sintered body having 93% of the theoretical density was obtained as an aluminum/vanadium dioxide bonded sample. It was confirmed that its thermal conductivity is 13 W/mK higher than 4 W/mK corresponding to the thermal conductivity of vanadium dioxide itself.

Example 3

The copper powder in Example 1, vanadium dioxide powder (subjected to heat treatment), and carbon fiber (pitch-based, chopped fibers, length 6 mm) were kneaded together with a mortar. The volume fractions of copper, vanadium dioxide, and carbon fiber were, respectively, 0.25, 0.5, and 0.25. After that, in a vacuum, heat treatment was performed by an electric-current sintering apparatus with a molding pressure of 30 MPa at a temperature of 700° C. for 30 minutes. As a result, obtained was a dense sintered body having 96% of the theoretical density. It was confirmed that its thermal conductivity is 27 W/mK and is higher than the thermal conductivity of vanadium dioxide itself.

Comparative Example 1

Aluminum powder (purity 99% up, particle size 300 μm mesh under, atomized powder) or carbon fiber (pitch-based, chopped fibers, length 6 mm) was bonded to vanadium dioxide powder (purity 99.9%, average particle diameter 1 μm). For an improvement in close adhesion, the vanadium dioxide powder was subjected to heat treatment in advance, similarly to Example 1. Weighing was performed such that a volume fraction of 0.50 is obtained for each of aluminum and carbon fiber, and then mixture was performed by a planetary stirrer. Note that, before use, the carbon fiber was dispersed ultrasonically in ethanol in advance. After that, in a vacuum, sintering was performed by an electric-current sintering apparatus with a molding pressure of 30 MPa. The aluminum/vanadium dioxide was heated at 550° C. for 30 minutes, and the carbon fiber/vanadium dioxide was heated at 950° C. for 30 minutes. As a result, an aluminum/vanadium dioxide bonded sample had 87% of the theoretical density and a carbon fiber/vanadium dioxide bonded sample had 75% of the theoretical density. Thus, no dense sintered body was obtained in both cases. In the carbon fiber/ vanadium dioxide bonded sample, V2O3 was generated due to the progress of chemical reaction of each material.

Example 4

Examined was influence on the material of a substrate due to heating of a chip. Used were three types of substrates different in composition: 1) the volume fraction of copper 1.00 (hereinafter, referred to as a copper substrate), 2) the volume fraction of copper 0.50 and the volume fraction of vanadium dioxide 0.50 (hereinafter, referred to as a copper/vanadium dioxide substrate), and 3) the volume fraction of vanadium dioxide 1.00 (hereinafter, referred to as a vanadium dioxide substrate). Preparations in material for the substrates are the same as those in Example 1. Each sample was made into a plate material having dimensions of 30×30×5 mm by machining, for use as a substrate.

For testing, a ceramic microheater having dimensions of 10×10×1 mm was stuck onto the center of each substrate with silver paste for die bonding and then heat generation of a chip was simulated with the output of the heater. The surface temperature of the chip (namely, the heater) and the surface temperature of the substrate (temperature of a place at a distance of 5 mm from the chip) were measured by a thermocamera. Heating conditions were as follows: the output of the heater 9 W, and the duration of the output 180 seconds.

Figure 4:
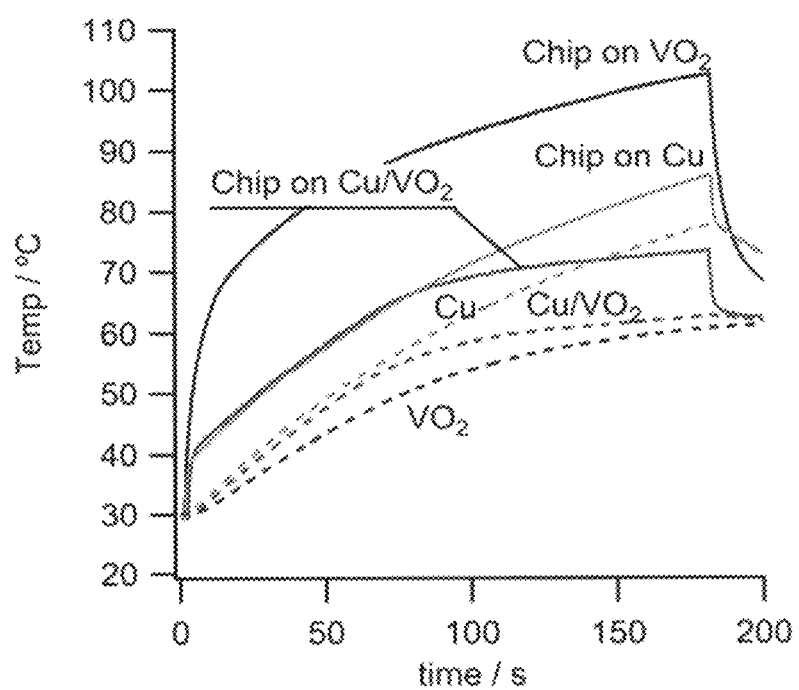
FIG. 4 illustrates changes in the temperatures of chips mounted on respective types of substrates based on samples in Example 4 (indicated with solid lines) with the temperatures of the substrates indicated with dotted lines, the substrates being of three types: a substrate of copper (Cu), a substrate of copper having a volume fraction of 0.50 and vanadium dioxide having a volume fraction of 0.50 (Cu/VO2), and a substrate of vanadium dioxide (VO2).

Results are shown in FIG. 4. The temperature of the chip on each substrate is indicated with a solid line, and the temperature of each substrate is indicated with a broken line. The chip mounted on the copper substrate gradually rises in temperature as heating time elapses. However, the chip mounted on the vanadium dioxide substrate rapidly rises in temperature at the beginning of heating, leading to a higher temperature than that of the copper substrate. The reason is that, since the vanadium dioxide substrate has a low thermal conductivity, the substrate is not heated uniformly, namely, only the periphery of the place on which the chip is mounted is heated. Thus, although the temperature of the substrate is suppressed at or below the transition temperature, the effect of latent heat of the substrate does not work to suppression of a rise in the temperature of the chip. Meanwhile, regarding the copper/vanadium dioxide substrate improved in thermal conductivity, when its plate material reaches the transition temperature, a rise in the temperature of the chip is suppressed, so that a rise in temperature can be further suppressed in comparison to the copper plate.

Example 5

A copper plate material having a thickness of 0.1 mm (purity 99.96%) and vanadium dioxide powder were layered one on another, and then were in a vacuum treated by an electric-current sintering apparatus with a molding pressure of 30 MPa at 550° C. for 30 minutes. The vanadium dioxide powder was subjected to heat treatment in advance, similarly to Example 1.

Figure 5:
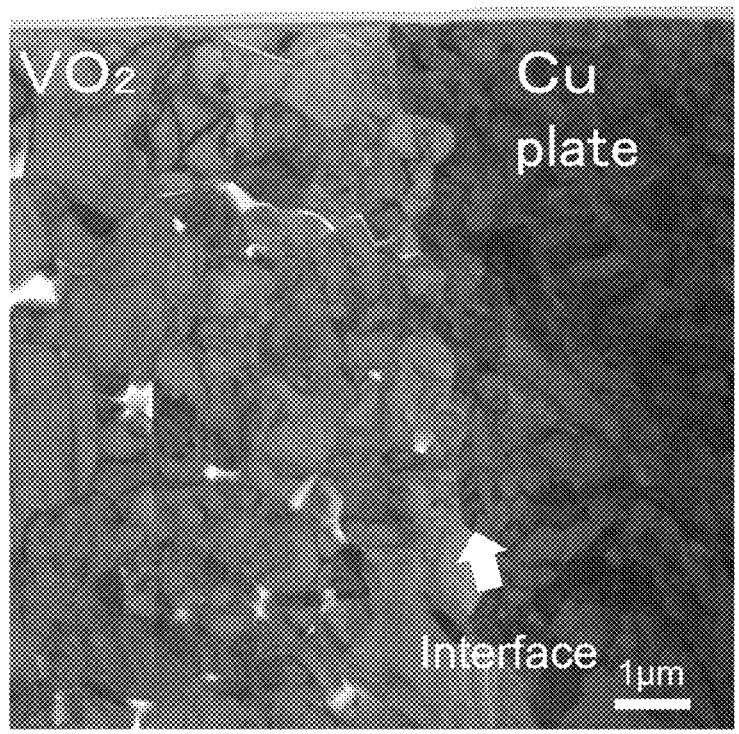
FIG. 5 is an electron micrograph of the bonded state between vanadium dioxide (VO2) and a copper plate material (Cu plate material) based on a sample in Example 5.

FIG. 5 is an electron micrograph of the bonded interface of a sample in Example 5. Referring to FIG. 5, it can be found that the copper plate material and vanadium dioxide are bonded together without any void.

The layered body in Example 5 underwent a heat cycle test covering the metal-insulator transition temperature. As a temperature profile, heating/cooling was repeated in the range of from 45 to 90° C. at 5° C./min. Even under a 100-cycle test, no detachment occurred.

Example 6

Figure 7:
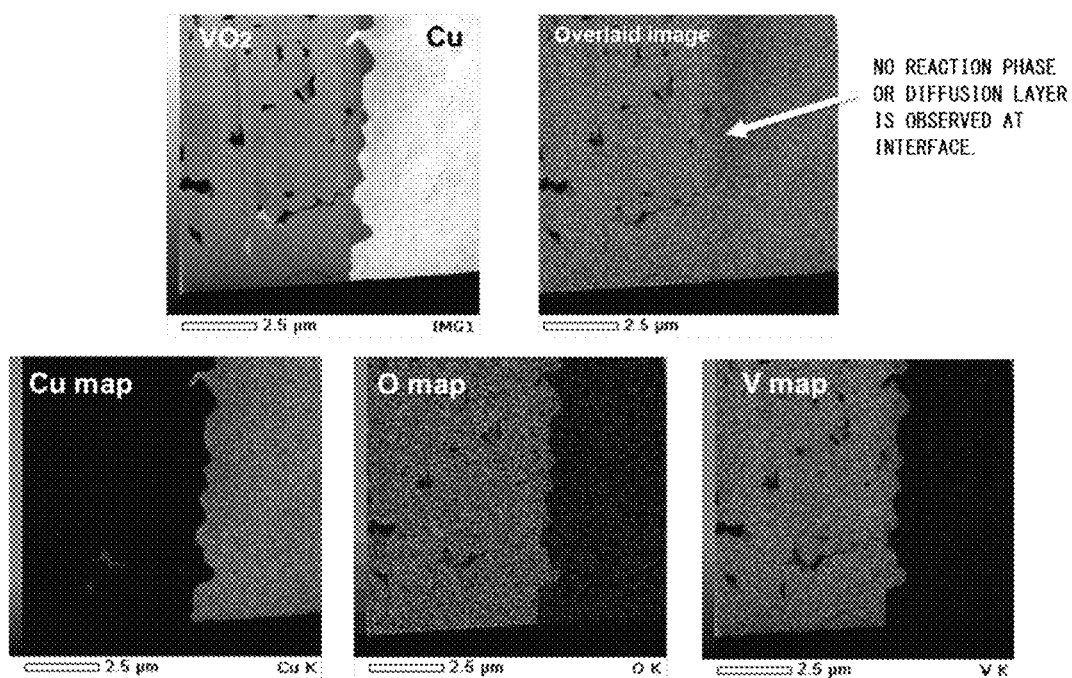
FIG. 7 shows results of EDX composition mapping of the sample in Example 5.

The interface of the sample in Example 5 was analyzed through scanning transmission electron micrographs (STEM) and by an energy dispersive X-ray fluorescence analyzer (EDX). FIG. 7 illustrates EDX composition maps. Referring to FIG. 7, it was revealed that a pure interface is formed because of no observation of any diffusion layer or reaction phase near the interface.

Comparative Example 2

Figure 6:
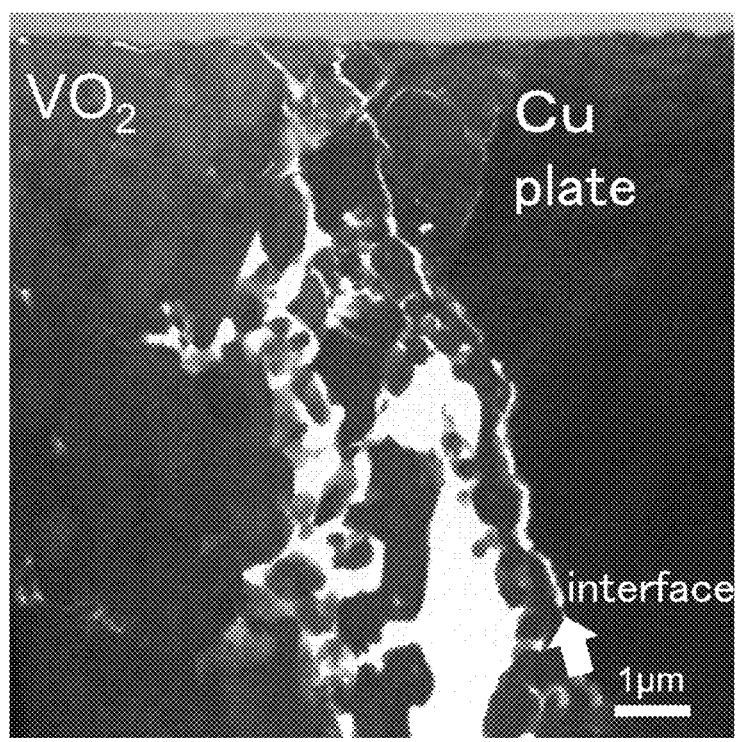
FIG. 6 is an electron micrograph of the bonded state between vanadium dioxide (VO2) with no heat treatment and a copper plate material (Cu plate material) based on a sample in Comparative Example 2.

A copper plate material having a thickness of 0.1 mm (purity 99.96%) and vanadium dioxide powder were layered one on another, and then were in a vacuum treated by an electric-current sintering apparatus with a molding pressure of 30 MPa at 550° C. for 30 minutes. The vanadium dioxide powder was subjected to no heat treatment in advance. FIG. 6 is an electron micrograph of the bonded interface of a sample in Comparative Example 2. Referring to FIG. 6, it can be found that many voids are present because the copper plate material and vanadium dioxide are low in close adhesion.

Comparative Example 3

Figure 8:
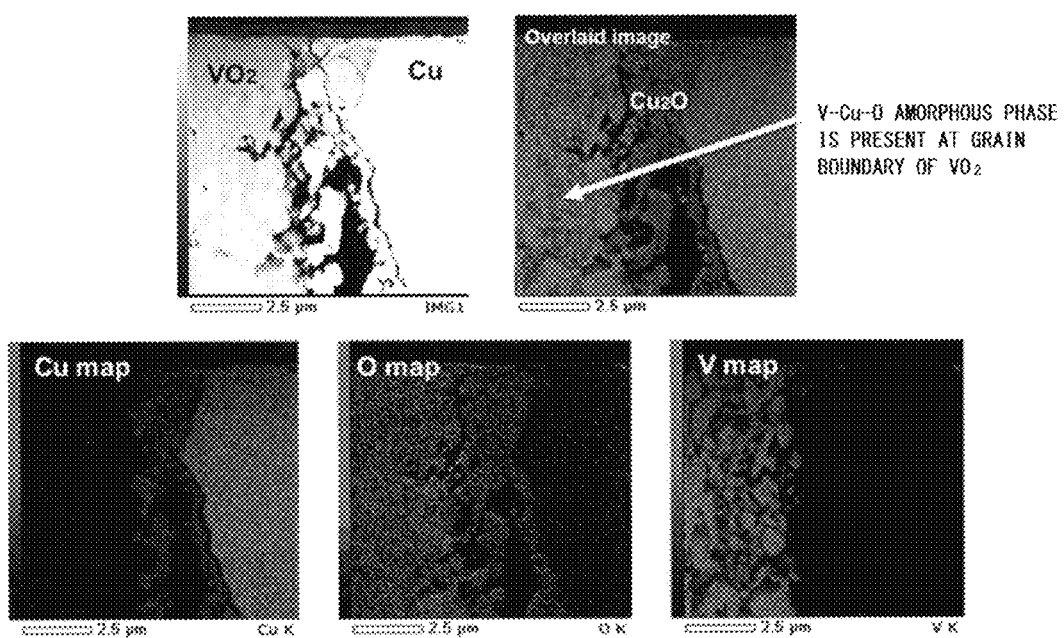
FIG. 8 shows results of EDX composition mapping of the sample in Comparative Example 2.

The interface of the sample in Comparative Example 2 was analyzed through scanning transmission electron micrographs (STEM) and by an energy dispersive X-ray fluorescence analyzer (EDX). FIG. 8 illustrates EDX composition maps. As a result, as illustrated in FIG. 8, a $Cu_2O$ phase was present at the interface, and an amorphous Cu-V-O diffusion layer was clearly observed near the grain boundary of VO2 near the interface. It can be thought that formation of such reaction phases prevents formation of a dense interface.

Example 7

Under conditions similar to those in Example 5, produced was a layered body including a plurality of layers identical in thickness each including a copper plate material having a thickness of 0.1 mm and vanadium dioxide layered one on another. The volume fraction of copper was 0.29. With the direction of heat transfer of the layered body in Example 6 defined as the planar direction of the copper plate, the thermal conductivity (vertically aligned copper) was measured. Results are shown in Table 1. Data in Example 1 is also shown for comparison. Referring to Table 1, it can be found that a considerable improvement is made in thermal conductivity even with the same volume ratio of copper content. Note that, as described in Example 1, the quantity of latent heat is determined based on the volume fraction of vanadium dioxide. Therefore, the orientation of copper is effective for an increase in thermal conductivity with the quantity of latent heat kept.

TABLE 1

| | Thermal conductivity [W/mK] |
|---|---|
| Copper/vanadium dioxide layered body (vertical orientation) | 103 ± 2 |
| Copper/vanadium dioxide powder bonded material (volume fraction of copper 0.29), from interpolation in FIG. 3 | 24 |
| Copper/vanadium dioxide layered body (vertical orientation) after heat cycle test | 102 ± 1 |

The present layered body underwent a heat cycle test covering the metal-insulator transition temperature. Heating/cooling was repeated in the range of from 45 to 90° C. at 10° C./min. Even under a 100-cycle test, no detachment occurred. After the heat cycle test, no deterioration occurred in thermal conductivity. (Table 1)

Example 8

Copper powder (purity 99.9%, particle size 45 μm mesh under, electrolytic copper powder) and tungsten-doped vanadium dioxide powder (phase transition temperature 10° C., average particle diameter 1 μm) were bonded together. For an improvement in close adhesion, the tungsten-doped vanadium dioxide powder was subjected to heat treatment at 250° C. for 20 minutes in the air in advance, resulting in having an excess of oxygen. Each type of powder was weighed such that a volume fraction of 0.50 is obtained for copper, and then mixing was performed with a mortar. After that, in a vacuum, treatment was performed by an electric-current sintering apparatus with a molding pressure of 30 MPa at 550° C. for 30 minutes. A produced sample was a dense sintered body having 96% of the theoretical density.

Example 9

The copper powder in Example 1 and chromium-doped vanadium dioxide powder (phase transition temperature 120° C., average particle diameter 1 μm) were bonded together. For an improvement in close adhesion, the chromium-doped vanadium dioxide powder was subjected to heat treatment in advance, resulting in having an excess of oxygen.

Each type of powder was weighed such that a volume fraction of 0.50 is obtained for copper, and then mixing was performed with a mortar. After that, in a vacuum, treatment was performed by an electric-current sintering apparatus with a molding pressure of 30 MPa at 700° C. for 30 minutes. A produced sample was a dense aggregate having 97% of the theoretical density. It was confirmed that its thermal conductivity is 31 W/mK and is higher than the thermal conductivity of vanadium dioxide itself.

Example 10

An aggregate of vanadium dioxide and copper produced under the conditions in Example 1 (volume fraction of copper 0.50) was immersed in dilute sulfuric acid having a molar concentration of 2 mol/L for 24 hours. As a result, the shape of the sample was the same as that before the immersion. No coloring of the dilute sulfuric acid occurred.

Comparative Example 4

Vanadium dioxide produced under the conditions in Example 1 (volume fraction of copper 0.00) was immersed in dilute sulfuric acid having a molar concentration of 2 mol/L for 24 hours. As a result, the sample dissolved completely in the dilute sulfuric acid, and the dilute sulfuric acid colored in blue.

Example 11

Figure 9:
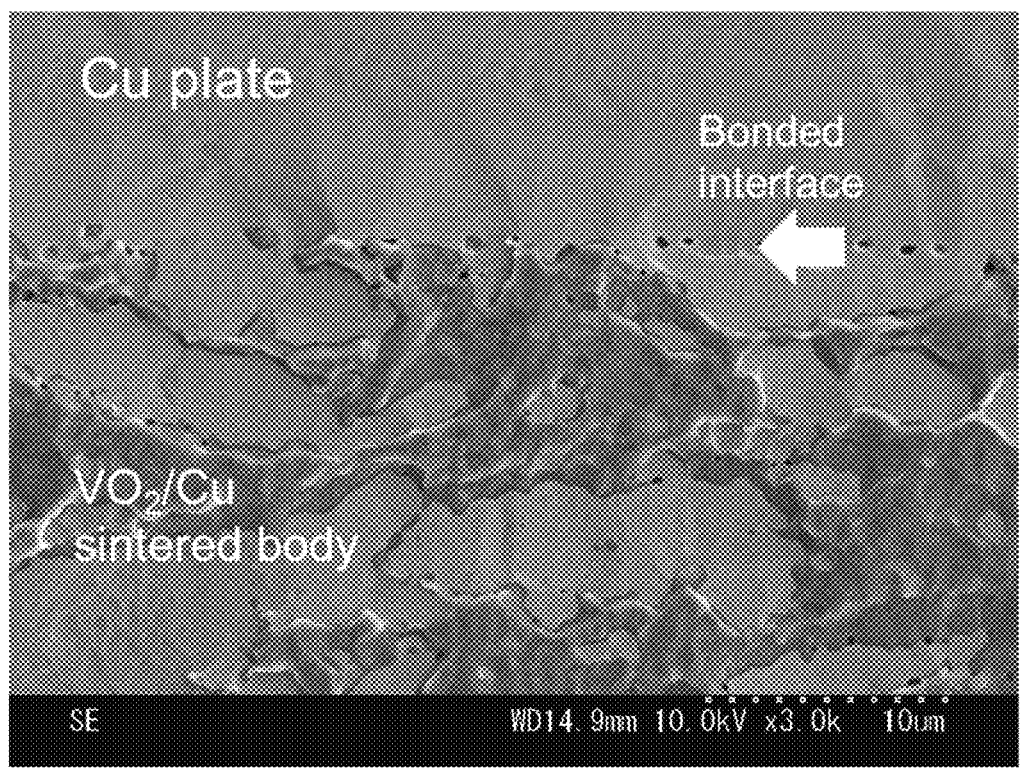
FIG. 9 is a scanning electron micrograph of the bonded interface of a bonded body in Example 11.

Under the conditions in Example 1, a dense sinter of vanadium dioxide powder and copper powder (volume fraction 0.50) (solid heat storage material) was produced in advance and then was made tabular in shape. The dense sintered body and a copper plate (purity 99.96%, thickness 1 mm) were stacked together, and then were heated at 600° C. under a pressure of 30 MPa for 30 minutes. In this case, the atmosphere was a vacuum. An obtained bonded body of the sinter and the copper plate was cut orthogonally to its interface with a cutter. Then, a section was polished and then was subjected to ion milling. The bonded interface was observed with a scanning electron microscope. As illustrated in FIG. 9, an interface in close adhesion is formed. It was confirmed that a favorable composite of the sintered body and the copper plate material is obtained due to diffusion bonding.

The invention claimed is:

1. A solid heat storage material comprising a bonding of vanadium dioxide and a thermally conductive substance higher in thermal conductivity than the vanadium dioxide, the thermally conductive substance being dispersed in the vanadium dioxide, the vanadium dioxide and the thermally conductive substance adhering at 90% or more of theoretical density, the thermally conductive substance having a volume fraction of 0.03 or more,
   wherein no diffusion layer and no reaction phase are present at a bonded interface between the vanadium dioxide and the thermally conductive substance.

2. The solid heat storage material according to claim 1, wherein the thermally conductive substance is copper.

3. The solid heat storage material according to claim 1, which is obtained by sintering and bonding vanadium dioxide comprising an excess of oxygen and the thermally conductive substance.

4. The solid heat storage material according to claim 1, wherein the thermally conductive substance consists of a metal with a work function smaller than that of vanadium dioxide.

5. The solid heat storage material according to claim 1, wherein the vanadium dioxide has a transition temperature adjusted by doping.

6. A composite comprising: the solid heat storage material according to claim 1; and copper; wherein the solid heat storage material and the copper are bonded together.

7. A solid heat storage material comprising a bonding of vanadium dioxide and a thermally conductive substance higher in thermal conductivity than the vanadium dioxide, the thermally conductive substance being dispersed in the vanadium dioxide, the vanadium dioxide and the thermally conductive substance adhering at 90% or more of theoretical density, the thermally conductive substance having a volume fraction of 0.03 or more,
   wherein the thermally conductive substance has the form of linear or tabular.

8. The solid heat storage material according to claim 7, wherein the thermally conductive substance is copper.

9. The solid heat storage material according to claim 7, which is obtained by sintering and bonding vanadium dioxide comprising an excess of oxygen and the thermally conductive substance.

10. The solid heat storage material according to claim 7, wherein the thermally conductive substance consists of a metal with a work function smaller than that of vanadium dioxide.

11. The solid heat storage material according to claim 7, wherein the vanadium dioxide has a transition temperature adjusted by doping.

12. A composite comprising: the solid heat storage material according to claim 7; and copper; wherein the solid heat storage material and the copper are bonded together.

* * * * *